United States Patent [19]

Rutledge

[11] 3,867,204

[45] Feb. 18, 1975

[54] MANUFACTURE OF SEMICONDUCTOR DEVICES

[75] Inventor: James L. Rutledge, Saratoga, Calif.

[73] Assignee: Motorola, Inc., Franklin Park, Ill.

[22] Filed: Mar. 19, 1973

[21] Appl. No.: 342,926

[52] U.S. Cl. .................. 148/188, 148/187, 148/190, 357/23

[51] Int. Cl. ............................................. H01l 7/34

[58] Field of Search ............. 148/188, 187, 190, 1.5

[56] References Cited

UNITED STATES PATENTS

| | | | |
|---|---|---|---|
| 3,653,978 | 4/1972 | Robinson et al. | 148/1.5 |
| 3,696,276 | 10/1972 | Boland | 148/187 X |
| 3,719,535 | 3/1973 | Zoroglu | 148/187 |
| 3,748,198 | 7/1973 | Basi et al. | 148/188 |
| 3,753,806 | 8/1973 | Adamic | 148/188 |

*Primary Examiner*—G. Ozaki
*Attorney, Agent, or Firm*—Vincent J. Rauner; Henry T. Olsen

[57] ABSTRACT

A self aligning method of manufacture of MOS devices or integrated circuits includes the step of providing a doped glassy layer on the surface of a relatively high resistivity starting semiconductor body. The doping in the glassy layer is of the opposite conductivity type from that of the source and drain to be formed to define the MOS device. For example, for making N-channel devices, a P-type dopant such as boron would be part of the glass, while if P-channel devices were being made, a N dopant such as phosphorous would be utilized. The glassy layer is then etched to open windows for the source and drain diffusion and the surface of the starting wafer is diffused from the glassy layer during the diffusion of the source and drain.

7 Claims, 4 Drawing Figures

$$V_T = \frac{X_i}{K_i}(Q_{SS} + Q_D)$$

MANUFACTURE OF SEMICONDUCTOR DEVICES

BACKGROUND OF THE INVENTION

This invention relates to the manufacture of semiconductor devices and more particularly to the manufacture of MOS devices and integrated circuits.

In the semiconductor industry, the term MOS, while originally being the acronym for Metal-Oxide-Semiconductor, has become synonymous with any device which is of the insulated gate field effect transistor type whether or not the insulating gate is actually an oxide and whether or not the electrodes of the device are truly metal. In accordance with this present terminology as used in the art, the term MOS is used herein as intended to be applicable to all such devices. The four functional parts of a MOS transistor are the source, the drain, the gate, and the substrate. MOS devices are almost ideal switches since when the gate and source potentials are equal, no current flows between the source and the drain. However, when the gate voltage with respect to the source is raised to a critical level called threshold voltage, the transistor turns on and current can flow from source to drain. In a P-channel device, the voltage on the gate would be negative to establish an electrostatic field that inverts the N material under the gate to a P depletion region between source and drain. If the devices were N-channel devices the voltage on the gate would be positive to convert the P material under the gate to a N depletion region between source and drain. The threshold voltage in either case is thus determined largely by the doping level or initial resistivity of the material beneath the gate which must be inverted to affect the switching action.

The threshold voltage of an MOS transitor is the most important proces dependent device parameter and generally low threshold voltages are required. An integrated circuit with low threshold transistors will operate with smaller, and hence more economic, power supplies than a high threshold circuit. An even more desirable feature is that the low voltage circuit is directly compatible with bipolar ICs, that is they require and produce the same input and output signal swings. This compatibility gives the system designer more flexibility. Additionally, low signal voltages necessarily yield higher operating frequencies.

The advantages of low voltage MOS are apparent. The best method of producing it is not as apparent. There are several ways of modifying processes and device structures to achieve lower threshold voltages. From Crawford, *MOSFET IN CIRCUIT DESIGN* (McGraw Hill) (1967), the equation for threshold voltage $V_T$ can be written as:

$$V_T = X_{i\,/K_i}\,(Q_{SS} + Q_D)$$

Where $Q_{SS}$ is the effective surface state charge density per unit area, $Q_D$ is the bulk charge per unit area.

$X_i$ is the gate dielectric thickness.

$K_i$ is dielectric constant of the gate dielectric.

Thus, from the equation, it is readily seen that a change in the dielectric constant of the gate insulator $K_i$ and/or the gate dielectric thickness, $X_i$, will result in a change in threshold voltage. Similarly, a change in the doping of the silicon substrate will change the $Q_{SS}$ and the $Q_D$. The various alternatives toward lowering threshold potential have various trade-offs, and it is an object of this invention to minimize those trade-offs while still maintaining or improving the $Q_{SS}$ and $Q_D$.

In the manufacture of standard MOS semiconductor devices and integrated circuits, it is common to utilize a relatively high doped substrate for the purpose of fabricating devices with the desired threshold voltage.

Thus, from the starting material, the wafer is masked, windows opened, and standard source and drain diffusions made together with the gate electrode either by standard metal oxide semiconductor techniques or self aligned silicon gate techniques. However, the relatively low resistivity starting substrate creates a parasitic capacitance which reduces the speed of operation of the devices. One method of eliminating this problem has been to utilize a relatively high resistivity starting substrate and manufacture devices in accordance with the foregoing, but this raises the threshold voltage. The threshold voltage can be adjusted by the use of ion implantation techniques. It is an object of this invention to provide a method of manufacturing MOS devices and circuits having high speed and low threshold without the utilization of complicated and expensive ion implantation techniques. It is a further object of this invention to provide a method of manufacturing low threshold high speed MOS devices and circuits which is economical and readily adaptable to wellknown semiconductor processing techniques.

SUMMARY OF THE INVENTION

In accordance with the foregoing, there is provided a method of manufacturing a semiconductor device comprising the steps of coating a relatively high resistivity substrate with a glassy layer containing a dopant source, opening windows in said glassy layer, depositing a dopant source of the opposite conductivity on the surface of the wafer, and heating said wafer to diffuse the dopant from the glassy layer into the surface of the wafer covered thereby while simultaneously forming a source and drain region in the windows.

THE DRAWINGS

Further objects and advantages of the invention will be understood from the following complete description thereof and from the drawings wherein.

COMPLETE DESCRIPTION

Figure 1:
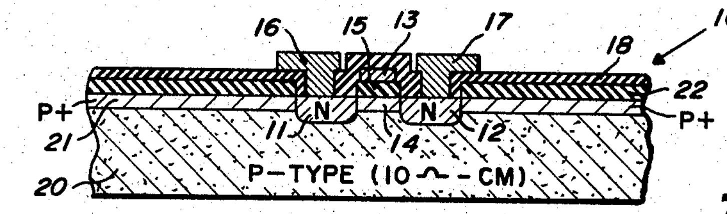
FIG. 1 is a cross section of a completed MOS device manufactured in accordance with the invention.

Most MOS integrated circuits have utilized P-channel MOS transistors. In addition, N-channel transistors can be and are being made utilizing the same techniques. Integrated circuits made with N-channel transistors would offer more advantages over the more usual P-channel devices. The most obvious advantage stems from the higher mobility of the charge carriers in the N-channel device since the N-channel device uses electrons as carriers. P-channel transistors use holes for conduction. Since electron mobility is approximately twice that of whole mobility under the same conditions, an N-channel device will have one-half the on resistance or impedance of an equivalent P-channel device.

Therefore, N-channel integrated circuits can be smaller for the same complexity, or even more importantly, they can be more complex with no increase in silicon area. Along with packing density N-channel circuits offer a speed advantage over P-channel circuits since they are smaller and the speed is a direct function of the capacitance.

However, a fixed positive charge also exists at the oxide silicon interface. This charge called $Q_{SS}$ results from the materials and the various steps of the manufacturing process. Since it is positive it tends to make the device normally on. Further, most of the contaminants for N-channel and P-channel devices are positively charged mobile carriers. Since the N-channel transistors operate with a gate positively charged with respect to substrate, these positively charged contaminants collect along the oxide-silicon interface. This contaminant charge, $Q_C$ causes a shift in threshold voltage and together with $Q_{SS}$ tends to make the N-channel transistor normally on. On the other hand, in a P-channel device with the gate electrode operating negatively, these positively charged mobile ions gather at the silicon-oxide interface and tend to raise the threshold voltage. This is generally a more acceptable characteristic than the on condition induced in the N-channel device, hence the commercial preference for P-channel devices.

One of the major factors that influences the threshold voltage term $Q_D$ of an MOS device is the doping level in the silicon substrate. Increasing the doping level in an N-channel device helps offset the effects of $Q_C$ and $Q_{SS}$ by establishing a field in the opposite direction by heavily doping the channel. Unfortunately, this approach does not work because of a factor called source bias effect. Source bias effect causes the threshold voltage of an MOS device to vary with source voltage. This can be overcome if the source is at ground. However, it is not always desirable to have the source grounded; and, therefore, N-channel devices are ordinarily provided with a negative bias to the source to turn the device off.

Source bias effect is very dependent on the doping level of the bulk silicon—the higher the doping level the greater the threshold change for a given change in source voltage. The result is that if you dope an N-channel device heavily enough to combat the $Q_C/Q_{SS}$ field, the device is practically useless because its threshold is very unstable.

Thus, there is a great need for a reliable process for the manufacture particularly of N-channel devices which can overcome the various problems set forth hereinabove.

As shown in FIG. 1, an N-channel MOS transistor 10 includes a diffused source 11 and a diffused drain 12 and a gate electrode 13 overlying and separated from a channel 14 by an insulating layer 15. Ohmically connected to the source 11 and drain 12 are electrodes 16 and 17 which are insulated from each other and from the gate electrode 13 by an insulating layer 18. In accordance with the invention, the MOS transistor 10 is manufactured in a substrate of relatively low conductivity having a surface region having a relatively high conductivity. The layer 22 of insulating material may be the result of the same processing step which produces the insulation 15 underlying the gate electrode 13 as shall be explained in further detail hereinafter.

Figure 2:
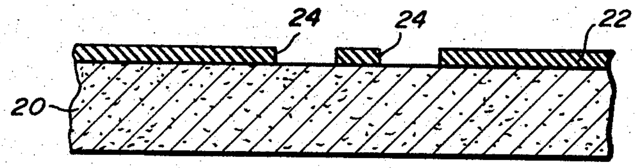
FIGS. 2 and 3 are successive steps in the manufacture thereof.
Figure 3:
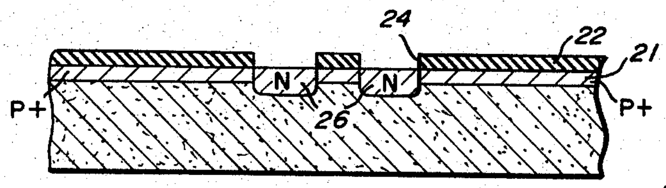

As shown in FIG. 2, a P-type silicon substrate 20 is provided and an insulating or glass material 22 is applied to the whole surface thereof. Windows 24 are etched in the insulating layer 22 in a known manner by applying a masking coat of resist to the surface of the insulation and etching out the windows 24. N-type doping material is deposited and diffused into substrate 20 to produce the diffused areas 26 in a known manner (FIG. 3). Following deposition of a thick oxide layer 18, further masking and etching steps are performed as necessary to produce the required contacts to the source and drain regions. If desired the material 22 between the N regions 26 may be etched out over the channel of the MOS transistor and a new gate insulation 15 produced by heating the assembly in oxygen or steam. The MOS transistor can be completed by depositing metal on the insulating layer 18 making contact to the N regions 26 and overlying a conductor over the gate insulation 15. The deposited metal is then etched to produce the appropriate interconnect pattern. This processing is wellknown.

Referring back to FIG. 2, the insulating material or glass 22 is between about 1,000–10,000 angstrom units thick and is doped with boron which is a P dopant. The substrate 20 has a relatively high resistivity of between 5–50 ohms-centimeters and preferably about 10. After the windows 24 are opened and an N-type dopant deposited, the chip is heated at about 1,115° C for one and one-half hours. During this heating time, the boron in the glass diffuses into the chip making the previously P surface of the chip under the glass a P+ region 21. This P+ layer has a resistivity of approximately 1 ohm-centimeter and is operative to reduce the $Q_{SS}$ of the device but has a minimal affect on the $Q_D$ since the material underlying the insulating gate has a higher doping level, but the bulk is not greatly changed. The doping is insufficient to create a source effect which would degrade and unstabilize the performance of the device.

Figure 4:
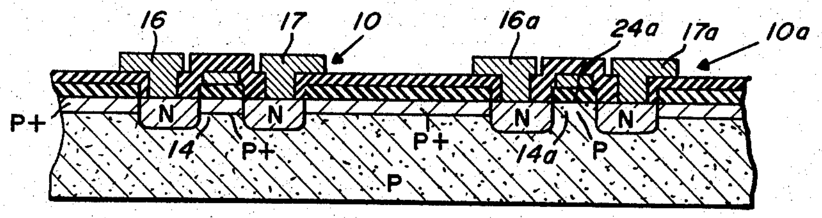
FIG. 4 is a further embodiment of a completed structure utilizing the method in accordance with the invention to provide both depletion mode and enhancement mode devices in the same structure.

In a further embodiment of the invention, depletion mode device 10*a* may be formed simultaneously by removing the doped glass from region 24*a* (FIG. 4) so that by suitable masking prior to diffusion the channel area 14*a* between contacts 16*a* and 17*a* retains a resistivity of approximately 10 ohm. cm. Thus channel 14*a* would in normal operation be on while channel 17 would be off.

What is claimed is:

1. A method of manufacturing an MOS transistor in the surface of a semiconductor substrate comprising the steps of:

providing a semiconductor substrate which is lightly doped with an impurity of a first conductivity type;

coating the entire surface of said substrate with a glass containing a dopant which is of said one conductivity type;

opening at least two windows in said doped glass to define a source and a drain for the MOS transistor;

depositing a dopant of the other conductivity type in said windows; and heating the substrate to diffuse dopant of said one conductivity type into the surface of the substrate and the dopant of the other conductivity type in the area underlying the windows.

2. A method as recited in claim 1 wherein said other conductivity type is an N dopant.

3. A method as recited in claim 1 wherein said starting substrate has a resistivity of 5–50 ohm-centimeters and the surface area under the glass following diffusion has a resistivity of approximately one ohm-centimeter.

4. A method as recited in claim 1 and further including the step of forming a gate electrode between said windows prior to performing the deposition and diffusion step.

5. Invention of claim 4 wherein said gate electrode is formed from polycrystalline silicon.

6. A method as recited in claim 5 in which said polycrystalline silicon is doped during the diffusion of the source and drain of the MOS transistor.

7. A method as recited in claim 1 and further including the step of coating the surface of the substrate following diffusion with a thick insulating layer and opening windows through said insulating layer to form contacts to the source and drain regions.

* * * * *